United States Patent [19]

Patel et al.

[11] 3,793,035

[45] Feb. 19, 1974

[54] METHOD OF DEVELOPING OPAQUELY COATED SENSITIZED MATRIX WITH PERIODATE CONTAINING SOLUTION

[75] Inventors: Himanshu M. Patel, Horseheads, N.Y.; Douglas A. Griswold, Blossburg, Pa.

[73] Assignee: Westinghouse Electric Corporation, Pittsburgh, Pa.

[22] Filed: May 16, 1973

[21] Appl. No.: 360,992

[52] U.S. Cl. .................................. 96/36.1, 96/48 R

[51] Int. Cl. .............................................. G03c 5/00

[58] Field of Search .........96/36.1, 48 R; 252/301.2, 252/301.3, 301.4

[56] References Cited

UNITED STATES PATENTS

| | | | |
|---|---|---|---|
| 3,658,530 | 4/1972 | Hedler et al. | 96/36.1 |
| 3,712,815 | 1/1973 | Rohrer et al. | 96/36.1 |
| 3,625,659 | 12/1971 | Hammond et al. | 252/301.4 R |
| 3,124,562 | 3/1964 | Naito et al. | 260/91.3 |

*Primary Examiner*—J. Travis Brown
*Assistant Examiner*—Edward C. Kimlin
*Attorney, Agent, or Firm*—W. G. Sutcliff

[57] ABSTRACT

A method for establishing a light absorbing pattern on a screen substrate of an image display device wherein opaquely coated sensitized matrix material is developed with a periodate containing solution to remove the sensitized matrix while leaving behind the opaque light absorbing pattern on the screen substrate.

8 Claims, No Drawings

METHOD OF DEVELOPING OPAQUELY COATED SENSITIZED MATRIX WITH PERIODATE CONTAINING SOLUTION

BACKGROUND OF THE INVENTION

This invention is related to the manufacture of color television display screens. The desirability of providing an opaque coating surrounding the phosphor display elements of a color television display screen are now well known in the art. The prior art manufacturing techniques are described in detail in U.S. Pat. No. 3,712,815 issued Jan. 23, 1973 entitled "METHOD OF MANUFACTURING A DISPLAY SCREEN", which patent is owned by the assignee of the present invention. The aforementioned patent discloses a technique in which a photosensitive layer is deposited upon a screen substrate and exposed to light through a conventional shadow mask to sensitize the photosensitive material in the layer. An opaque coating is then applied over the entire screen and the screen is treated with a developing solution which includes an oxidizing agent such as hydrogen peroxide and a chelating agent to remove the sensitized layer and the opaque coating contained thereon, while leaving undisturbed the desired opaque pattern which is directly exposed on the screen substrate. The hydrogen peroxide-chelating agent developing solution requires a rather high concentration of these materials and is therefore an expensive developing procedure. The hydrogen peroxide in the developing solution has a very high vapor pressure and hydrogen peroxide fumes can be particularly troublesome in the clean room facility in which this processing takes place. These fumes have an adverse effect on the light sensitivity of the polyvinyl alcohol-ammonium dichromate mixture used in other parts of the clean room. It is highly desirable to eliminate the hydrogen peroxide from the clean room.

The use of periodate containing solutions as an oxidizing agent for polyvinyl alcohol in slurry solution is described in U.S. Pat. No. 3,625,659. This prior art teaching discloses that periodate containing solutions can be used to lower the viscosity of the phosphor containing slurry to facilitate recovery of the phosphor material from the slurry.

Any number of oxidizing agents are known to dissolve polyvinyl alcohol but an efficient production process requires an oxidizing agent which is usable in low concentrations with a high speed of reactivity.

SUMMARY OF THE INVENTION

An improved method for establishing a light absorbing pattern on a screen substrate of an image display device is disclosed. A photosensitized polyvinyl alcohol layer which becomes less soluble upon exposure to radiations is first deposited onto the screen substrate. The sensitized coating is exposed to radiations in a predetermined pattern. The exposed sensitized polyvinyl alcohol coating is rinsed and the unexposed areas of said coating are removed from the substrate. An opaque material is applied to the exposed substrate and to the exposed sensitized polyvinyl alcohol layer. The opaquely coated substrate is then chemically developed to loosen and remove the sensitized polyvinyl alcohol coated layer, while leaving in place the opaquely coated pattern on the screen substrate. The chemical development is carried out with a periodate containing solution in a concentration of from about 0.02 to 0.4 weight percent. This method provides a significant improvement in operating efficiency in that the periodate containing solution can be used with a very low concentration of periodate, and also eliminates the need for a chelating agent in the developing solution.

DESCRIPTION OF THE PREFERRED EMBODIMENTS

The invention will now be described by way of a specific exemplary embodiment. The glass faceplate or display screen which is to be incorporated into the image display device is first cleaned and rinsed, and a coating of polyvinyl alcohol is applied thereto. The polyvinyl alcohol is sensitized with ammonium dichromate. The details of the coating process are more fully described in the aforementioned U.S. Pat. No. 3,712,815. A conventional aperture mask and light source are used thereafter to expose the sensitized coatings through the individual apertures in the mask, as is well known in the art. The mask is removed and the polyvinyl alcohol coating is subjected to a spray of deionized water developer to rinse away the soluble unexposed polyvinyl alcohol areas on the faceplate so as to leave PVA dots corresponding to the positions of the eventual green, blue, and red phosphor dots for the color television display screen. An opaque material containing a slurry suspension such as graphite in water available under the trade name "AQUADAG" which may be purchased from Acheson Colloids Company of Port Huron, Michigan. The opaque graphite coating thus covers the PVA dots as well as the glass substrate which was exposed by washing away the unexposed PVA. The graphite coating is porous to permit the chemical developing of the exposed sensitized PVA dots which remain on the faceplate underneath the graphite coating. The chemical developing solution removes the PVA dots and the opaque coating on the dot surface while leaving the opaque coating on the glass faceplate about the area from which the PVA dots have been removed.

The chemical developing solution according to the present invention is prepared by adding to about 1 gallon of distilled water, potassium periodate in an amount sufficient to provide a 0.05 weight percent content of potassium meta-periodate ($KIO_4$). The periodate containing solution is heated to a temperature of from about 130° to 140°F, the pH of the solution is about 6.5. Approximately 1 gallon of such solution is required to process a single faceplate for an image display device. The polyvinyl alcohol dot pattern is removed in about 20 seconds.

The periodate containing solution can be adjusted in pH over a wide range of from about pH 3 to about pH 9. The solution can be made basic by the addition of a proper amount of ammonium hydroxide. It has been discovered that the reactivity of the solution can be optimized when selected acids are added in an amount sufficient to lower the pH of the solution to about 3. Thus, about 0.5 milliliters of concentrated sulphuric acid is added per 1 gallon of periodate containing solution to provide a solution pH of about 3. The sulphuric acid is relatively inexpensive and provides a very effective means of speeding up the reactivity of the solution. Other acids which have been found useful include acetic acid and citric acid, which are also added to the periodate containing solution in amounts sufficient to adjust the pH preferably to about 3.

With the polyvinyl alcohol dots thus removed from the faceplate or screen substrate, a light absorbing pattern of opaque material has thus been provided on the screen substrate. The phosphor dots may now be deposited onto the screen in a well known manner to provide the high contrast screen of the present invention.

The invention has been described by reference to potassium meta-periodate as the specific periodate containing compound, but other soluble periodates including the alkaline periodates, alkaline-earth periodates and even periodic acid can be utilized in practicing the present invention. The periodate ion concentration can be widely varied over a range from about 0.02 to 0.4 weight percent of the solution with the optimum reactivity being obtained at about 0.05 weight percent when the solution has a pH of about 3.

The periodate contained in the developing solution eliminates the handling and contamination problem which hydrogen peroxide presented in the clean room. The potassium meta-periodate is particularly advantageous in that it is a soluble solid which has a low vapor pressure. The material can thus be easily handled in the clean room environment without adversely affecting the areas of the manufacturing process.

We claim as our invention:

1. An improved method for establishing a light absorbing pattern on a screen substrate of an image display device in which photosensitized polyvinyl alcohol which becomes less soluble upon exposure to radiation is first deposited onto the screen substrate, exposing the sensitized coating to radiation in a predetermined pattern, developing the exposed sensitized polyvinyl alcohol coating and removing the unexposed areas of said coating, applying to the substrate a coating of an opaque material to cover the exposed sensitized polyvinyl alcohol and the exposed substrate surface, and chemically developing the opaquely coated exposed sensitized polyvinyl alcohol to loosen and remove same while leaving the opaque coating on the screen substrate in the desired light absorbing pattern, the improvement wherein the chemical development is carried out with a periodate containing solution.

2. The method specified in claim 1, wherein the periodate concentration in the developing solution is from about 0.02 to 0.4 weight percent of the solution.

3. The method specified in claim 1, wherein the periodate is supplied as potassium meta-periodate in a concentration of about 0.05 weight percent of the developing solution.

4. The method specified in claim 1, wherein the pH of the periodate containing solution is from about 3 to 9.

5. The method specified in claim 1, wherein the pH of the solution is made basic by addition of ammonium hydroxide.

6. The method specified in claim 1, wherein the pH is made acidic by addition of selected acid of the group consisting of acetic acid, citric acid, and sulphuric acid.

7. The method specified in claim 1, wherein the pH of the solution is preferably about 3.

8. The method specified in claim 7, wherein the preferred acid is sulphuric acid.

* * * * *

UNITED STATES PATENT OFFICE

CERTIFICATE OF CORRECTION

Patent No. 3,793,035 Dated February 19, 1974

Inventor(s) Himanshu M. Patel, Douglas A. Griswold and Harold D. Wilcox

It is certified that error appears in the above-identified patent and that said Letters Patent are hereby corrected as shown below:

On the cover sheet

Change Item (75) to read -- Item (75) Inventors: Himanshu M. Patel, Horseheads, N.Y.; Douglas A. Griswold, Blossburg, Pa.; Harold D. Wilcox, Elmira, N.Y. --.

Signed and sealed this 12th day of November 1974.

(SEAL)
Attest:

McCOY M. GIBSON JR.
Attesting Officer

C. MARSHALL DANN
Commissioner of Patents